(12) United States Patent  
Matsumoto

(10) Patent No.: US 12,169,644 B2  
(45) Date of Patent: Dec. 17, 2024

(54) MEMORY SYSTEM

(71) Applicant: KIOXIA CORPORATION, Tokyo (JP)

(72) Inventor: Manabu Matsumoto, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 610 days.

(21) Appl. No.: 17/408,772

(22) Filed: Aug. 23, 2021

(65) Prior Publication Data

US 2022/0229587 A1 Jul. 21, 2022

(30) Foreign Application Priority Data

Jan. 20, 2021 (JP) ................. 2021-007161

(51) Int. Cl.
| | |
|---|---|
| G06F 3/06 | (2006.01) |
| H01L 23/00 | (2006.01) |
| H01L 23/367 | (2006.01) |
| H01L 23/498 | (2006.01) |
| H01L 25/065 | (2023.01) |
| H01R 12/71 | (2011.01) |

(52) U.S. Cl.
CPC .......... *G06F 3/0658* (2013.01); *G06F 3/0626* (2013.01); *G06F 3/0679* (2013.01); *H01L 23/367* (2013.01); *H01L 23/49833* (2013.01); *H01L 23/49838* (2013.01); *H01L 24/08* (2013.01); *H01L 24/16* (2013.01); *H01L 25/0655* (2013.01); *H01R 12/716* (2013.01); *H01L 2224/08225* (2013.01); *H01L 2224/16227* (2013.01); *H01L 2224/16238* (2013.01); *H01L 2924/15311* (2013.01); *H01L 2924/15313* (2013.01); *H01R 2201/06* (2013.01)

(58) Field of Classification Search
None
See application file for complete search history.

(56) References Cited

U.S. PATENT DOCUMENTS

| | | | |
|---|---|---|---|
| 7,417,871 B2 | 8/2008 | Haba | |
| 8,864,500 B1 | 10/2014 | Bhakta et al. | |
| 10,490,507 B1* | 11/2019 | Maxey | ................ H01L 23/5387 |
| 2008/0195817 A1 | 8/2008 | Hiew et al. | |
| 2011/0287588 A1 | 11/2011 | Tseng et al. | |
| 2017/0131748 A1 | 5/2017 | Izawa et al. | |
| 2019/0037695 A1 | 1/2019 | Li et al. | |
| 2019/0131203 A1 | 5/2019 | Kang et al. | |
| 2019/0304915 A1* | 10/2019 | Jain | ......................... H01L 28/40 |
| 2021/0407915 A1* | 12/2021 | Contreras | ........... H01L 25/0652 |

FOREIGN PATENT DOCUMENTS

| | | |
|---|---|---|
| JP | H09-83100 A | 3/1997 |
| TW | 201716914 A | 5/2017 |
| TW | 201917840 A | 5/2019 |

* cited by examiner

*Primary Examiner* — Hung K Vu
(74) *Attorney, Agent, or Firm* — Kim & Stewart LLP

(57) ABSTRACT

A memory system includes a nonvolatile memory, a controller configured to control the nonvolatile memory, a connector that is capable of electrically connecting the controller and a host, a first rigid substrate on which the nonvolatile memory and the controller are mounted, a second rigid substrate on which the connector is mounted, and a flexible substrate that is flexible and electrically connects the first rigid substrate and the second rigid substrate, wherein a thickness of the first rigid substrate is less than a thickness of the second rigid substrate.

20 Claims, 6 Drawing Sheets

MEMORY SYSTEM

CROSS-REFERENCE TO RELATED APPLICATION

This application is based upon and claims the benefit of priority from Japanese Patent Application No. 2021-007161, filed Jan. 20, 2021, the entire contents of which are incorporated herein by reference.

FIELD

Embodiments described herein relate generally to a memory system.

BACKGROUND

A memory system includes a connector portion for connecting to a host via a socket, and a component mounting portion on which a nonvolatile memory and a controller are mounted. When a memory system is used, the memory system is mounted on a mother substrate with the connector portion inserted into the socket on the mother substrate. The thickness of the substrate including the connector portion and the component mounting portion is determined by a standard, and the socket is made assuming the thickness of the substrate determined by the standard. For example, according to the standard PCI_Express_M.2_Specification, the thickness of the substrate is 0.8 mm. Since the mounting space of the memory system is limited, it is desirable to reduce the overall thickness when the memory system mounted on the mother substrate.

DETAILED DESCRIPTION

Embodiments provide a memory system having a substrate thickness determined by a standard and a reduced overall thickness when mounted on a mother substrate.

In general, according to one embodiment, a memory system includes a nonvolatile memory, a controller configured to control the nonvolatile memory, a connector that is capable of electrically connecting the controller and a host, a first rigid substrate on which the nonvolatile memory and the controller are mounted, a second rigid substrate on which the connector is mounted, and a flexible substrate that is flexible and electrically connects the first rigid substrate and the second rigid substrate, wherein a thickness of the first rigid substrate is less than a thickness of the second rigid substrate.

Hereinafter, embodiments of the present disclosure will be described.

In the present specification, a plurality of expressions are given to several elements as examples. The examples are not limited and other expressions maybe given to these elements. Further, another expression may be given to an element to which a plurality of expressions are not given.

The drawings are schematic, and the relationship between thicknesses and planar dimensions, the proportion of the thickness of each layer, and the like may differ from actual ones. In addition, there maybe portions where the dimensional relationships and proportions differ among the drawings.

First Embodiment

FIGS. 1 to 6 show a memory system according to a first embodiment. A memory system 1 is an example of a semiconductor device. Such a memory system 1 is mounted on an electronic device such as a personal computer (PC) or a mobile phone and functions as a storage device for the electronic device. The electronic device is also called a host.

Next, the configuration of the memory system 1 will be described.

Figure 1:
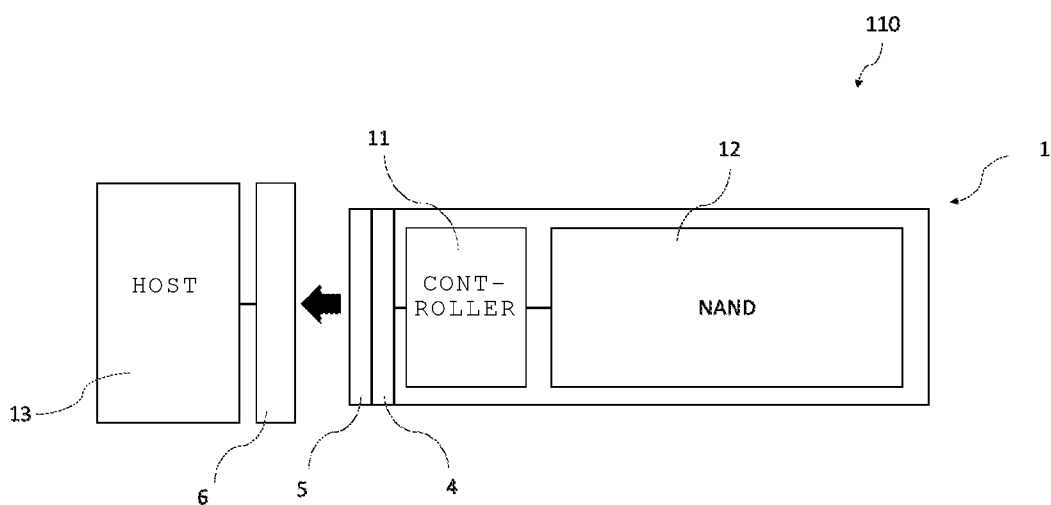
FIG. 1 is a view schematically showing a part of a configuration of an information processing system including a memory system according to a first embodiment.

FIG. 1 is a block diagram showing an example of the configuration of an information processing system 110. The information processing system 110 includes the memory system 1 and a host 13.

The memory system 1 includes a controller 11 and a nonvolatile memory 12. In addition to these, the memory system 1 includes, for example, a DRAM, a host interface (host I/F), and an electrically erasable and programmable ROM (EEPROM), but these are not shown here.

The controller 11 is a semiconductor integrated circuit that controls the operation of the nonvolatile memory 12.

The nonvolatile memory 12 is, for example, a NAND-type flash memory chip (NAND). The nonvolatile memory 12 is able to retain data therein even when power is not supplied.

The controller 11 and the nonvolatile memory 12 are each a chip or a package.

The substrate on which the controller 11 and the nonvolatile memory 12 are mounted is connected to a connector 5 via a flexible substrate 4. The host 13 is provided with a socket 6. By connecting the socket 6 and the connector 5, the memory system 1 is connected to the host 13.

For the communication interface of the host 13 and the memory system. 1, standards such as serial attached SCSI (SAS), serial advanced technology attachment (SATA), and peripheral component interconnect express (PCIe)® may be used.

Figure 2:
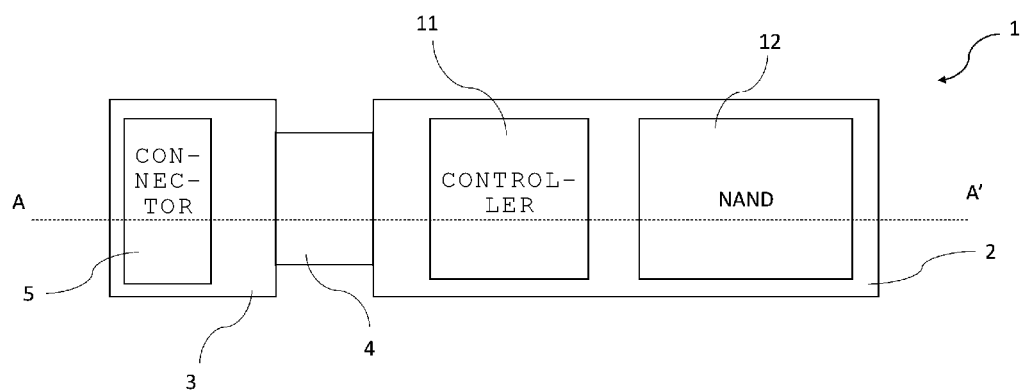
FIG. 2 is a top view of the memory system according to the first embodiment.

Next, the structure of the memory system 1 according to the first embodiment will be described. FIG. 2 is a top view of the memory system, and FIG. 3 is a cross-sectional view of the memory system 1.

As shown in FIG. 2, the memory system 1 includes a first rigid substrate 2, a second rigid substrate 3, and the flexible substrate 4. The first rigid substrate 2 and the second rigid substrate 3 each include a hard insulator and a conductive pattern provided on the insulator. The first rigid substrate 2 and the second rigid substrate 3 in the present embodiment are composed of a single-layer substrate, but may be composed of a multilayer substrate.

The first rigid substrate 2 and the second rigid substrate 3 are disposed so that its main surfaces are substantially parallel to each other. The second rigid substrate 3 faces the first rigid substrate 2 in an X direction. The first rigid substrate 2 and the second rigid substrate 3 are connected with the flexible substrate 4. The flexible substrate 4 is a flexible printed circuit (FPC). For example, the flexible substrate 4 includes a flexible insulating film and a conductive pattern covered with the insulating film.

Figure 3:
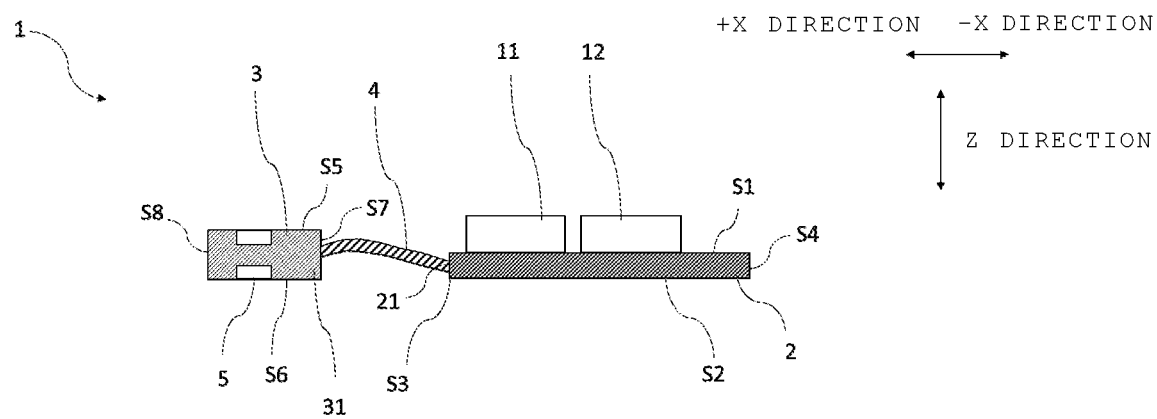
FIG. 3 is a cross-sectional view of the memory system according to the first embodiment.

FIG. 3 is a cross-sectional view seen from the dotted line A-A' of FIG. 2. In FIG. 3, a +X direction, a −X direction, a +Z direction, and a −Z direction are shown. The +X direction is parallel to a main surface of a mother substrate 8 described later, and is a direction from the nonvolatile memory 12 toward the controller 11. The −X direction is the opposite of the +X direction. When the +X direction and the −X direction are not distinguished, the direction is simply referred to as "X direction". A +Y direction is a direction that is parallel to the main surface of the mother substrate 8 and intersects (for example, substantially orthogonal to) the X direction. A −Y direction is opposite to the +Y direction. When the +Y direction and the −Y direction are not distinguished, the direction is simply referred to as "Y direction". The +Z direction is a direction perpendicular to the main surfaces of the first rigid substrate 2 and the second rigid substrate 3, intersecting the X and Y directions (for example, substantially orthogonal to each other), and a direction along which the controller 11 is spaced from the mother substrate 8. The −Z direction is the direction opposite to the +Z direction. When the +Z direction and the −Z direction are not distinguished, the direction is simply referred to as "Z direction". The Z direction is, for example, a thickness direction of the mother substrate 8. The directions described above are the same in FIGS. 4 to 6 and 8 to 12, which will be described to later.

Further, the first rigid substrate 2 includes a first main surface S1, a second main surface S2, a third surface S3, and a fourth surface S4. The first main surface S1 is a surface parallel to the X direction and faces the inner surface of a housing. For example, semiconductor components including the controller 11 and the nonvolatile memory 12 are mounted on the first main surface S1 in a ball grid array (BGA). The second main surface S2 is located on the opposite side of the first main surface S1 and faces the mother substrate 8. The mother substrate 8 is a substrate of the host 13 on which the memory system 1 is mounted. The third surface S3 is a surface perpendicular to the first main surface S1 and the second main surface S2 and parallel to the Z direction. The third surface S3 is a surface to which the flexible substrate 4 is connected. The third surface S3 includes a connection portion 21 to which the flexible substrate 4 is connected. The connection portion 21 is provided, for example, at the end portion of the first rigid substrate 2 on the +X direction side. The fourth surface S4 is a surface opposite to the third surface S3. The thickness of the first rigid substrate 2 is thinner than the thickness of the second rigid substrate 3.

Further, the second rigid substrate 3 includes a fifth main surface S5, a sixth main surface S6, a seventh surface S7, and an eighth surface S8. The fifth main surface S5 is a surface parallel to the X direction and faces the inner surface of the housing. The sixth main surface S6 is located on the opposite side of the fifth main surface S5 and faces the mother substrate 8. The fifth main surface S5 and the sixth main surface S6 include the connector 5 which is a connection portion that connects to the host 13. The seventh surface S7 is a surface to which the flexible substrate 4 is connected, and includes a connection portion 31 to which the flexible substrate 4 is connected. The connection portion 31 is provided, for example, at the end portion of the second rigid substrate 3 on the −X direction side. The eighth surface S8 is located on the opposite side of the seventh surface S7. The thickness of the second rigid substrate 3 is, for example, 0.8 mm. For example, components such as the controller 11 and the nonvolatile memory 12 are not mounted on the second rigid substrate.

Figure 4:
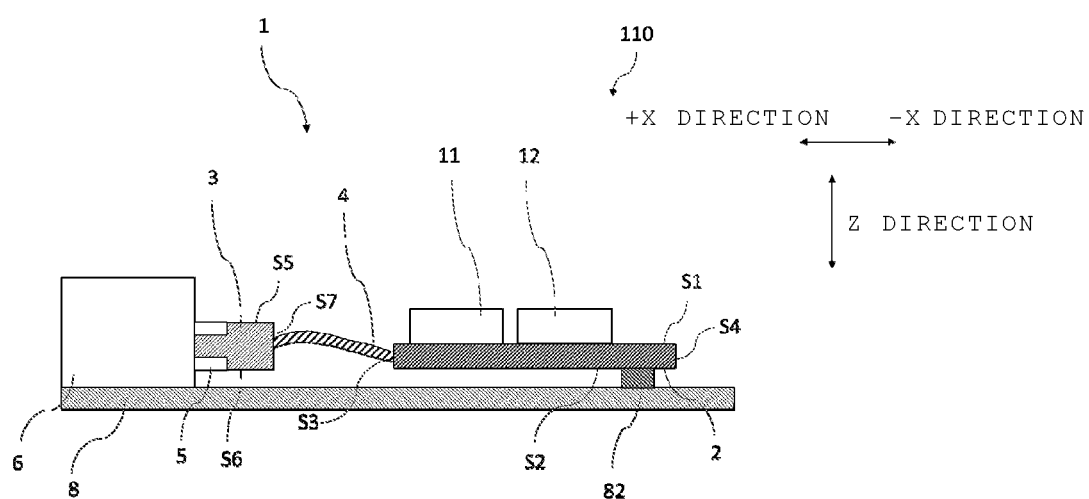
FIG. 4 is a cross-sectional view showing a partial configuration of the information processing system in which the memory system according to the first embodiment is mounted on a mother substrate.

Next, the structure of the information processing system in which the memory system according to the first embodiment is mounted on the mother substrate will be described. FIG. 4 is a cross-sectional view showing a part of the configuration of the information processing system 110 in which the memory system of the present embodiment is mounted on the mother substrate.

As shown in FIG. 4, the memory system 1 is inserted into the socket 6 and mounted on the mother substrate 8, and the information processing system 110 includes the memory system 1, the socket 6, and the mother substrate 8. The memory system 1 is disposed on a spacer 82 provided on the mother substrate 8. The flexible substrate 4 includes a first end portion 41a shown in FIG. 5 and a second end portion 41b shown in FIG. 6. The first end portion 41a is fixed to the connection portion 21 on the third surface S3 (side surface of the first rigid substrate 2) of the first rigid substrate 2. The second end portion 41b is fixed to the connection portion 31 on the seventh surface S7 (side surface of the second rigid substrate 3) of the second rigid substrate 3. The flexible substrate 4 has flexibility. The flexible substrate 4 connects the first rigid substrate 2 and the second rigid substrate 3 while being in a distorted (e.g., bent) posture, for example. The first rigid substrate 2 and the second rigid substrate 3 are electrically connected to each other via the flexible substrate 4. The flexible substrate 4 is an example of a "connection substrate". The structure of the flexible substrate 4 fixed to the first rigid substrate 2 and the second rigid substrate 3 will be described later. The second rigid substrate 3 is inserted into the socket 6 of the host 13 in the X direction. The host 13 and the memory system 1 are electrically connected by contact between a metal terminal (not shown) in the socket 6 and the connector 5. The seventh surface S7 is a surface perpendicular to the fifth main surface S5 and the sixth main surface S6 and parallel to the Z direction. The eighth surface S8 is the surface to be inserted into the socket 6.

When the memory system 1 is mounted on the mother substrate 8, the position of the first main surface S1 of the first rigid substrate is lower than the position of the fifth main surface S5 of the second rigid substrate. Further, the positions of the upper surfaces of the controller 11 and the nonvolatile memory 12 are lower than the position of the upper surface of the socket 6.

Figure 5:
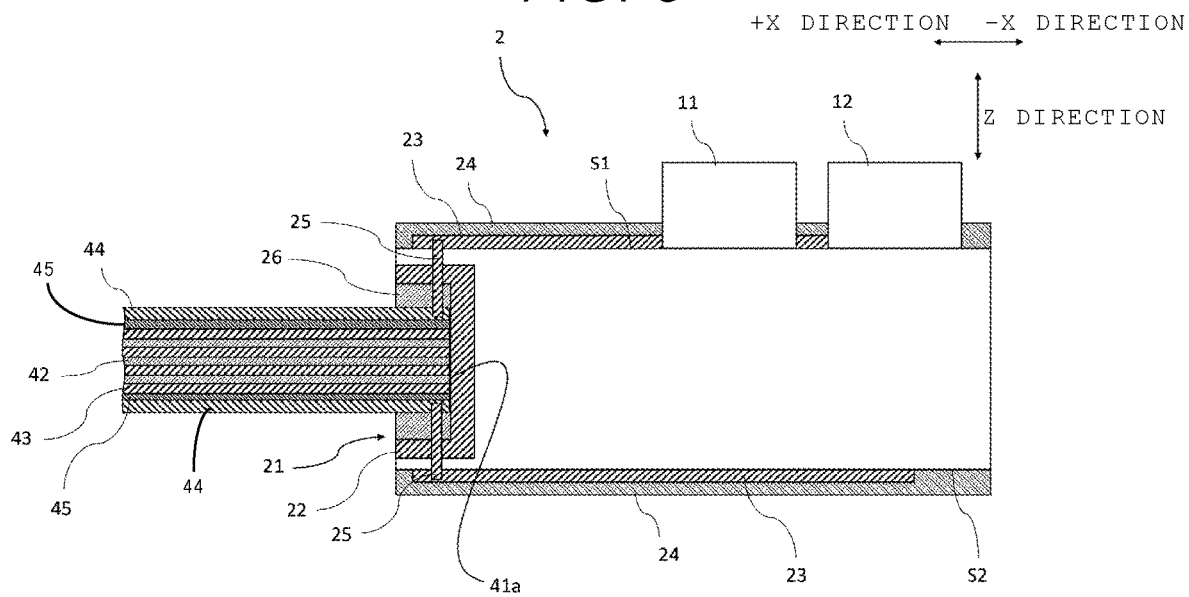
FIG. 5 is a cross-sectional view of a connection portion between a first rigid substrate and a flexible substrate of the memory system according to the first embodiment.
Figure 6:
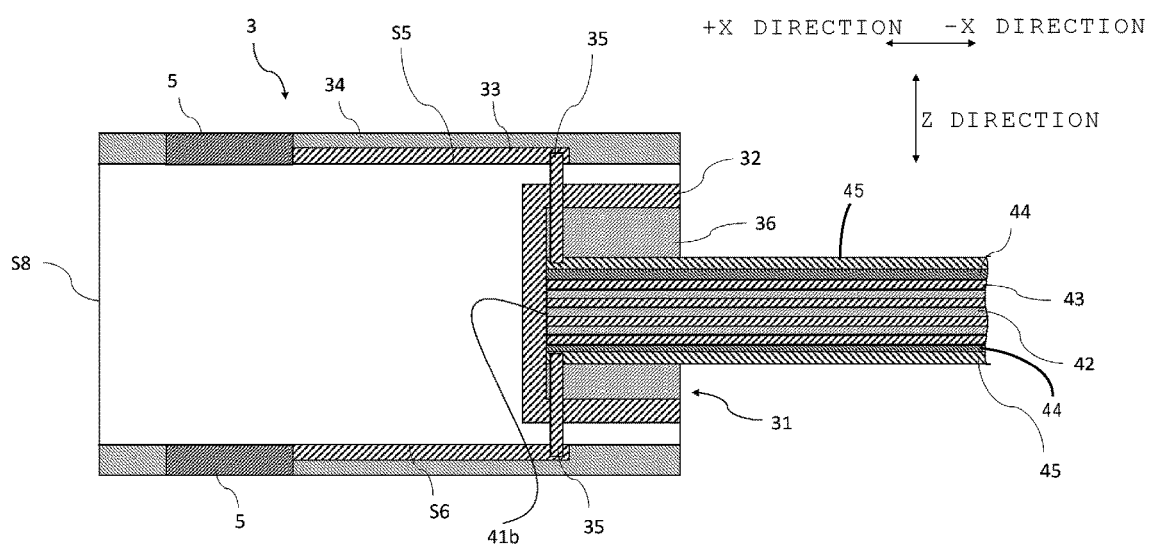
FIG. 6 is a cross-sectional view of a connection portion between a second rigid substrate and a flexible substrate of the memory system according to the first embodiment.

FIG. 5 is a cross-sectional view showing the connection portion 21 between the flexible substrate 4 and the first rigid substrate 2. FIG. 6 is a cross-sectional view showing the connection portion 31 between the flexible substrate 4 and the second rigid substrate 3.

The connection between the first rigid substrate 2 and the flexible substrate 4 will be described with reference to FIG. 5. The connection portion 21 of the first rigid substrate 2 is recessed toward the center of the substrate. A conductive portion 22 is provided along the recessed portion. The flexible substrate 4 is connected to a portion of the conductive portion 22 that is substantially parallel to the Z direction, e.g., substantially vertical. The area of the connection portion 21 between the flexible substrate 4 and the conductive portion 22 are is filled with an insulating member 26.

The flexible substrate 4 is in a state in which a conductive layer 43 and an insulating layer 42 are alternately stacked. The outside of the flexible substrate 4 is covered with an insulating layer 44 that acts as a cover. The insulating layer 44 is attached to the conductive layer 43 with an adhesive member 45.

A wiring 23, a resist 24, the controller 11, and the nonvolatile memory 12 are provided on the first main surface S1 of the first rigid substrate 2. Semiconductor components such as the controller 11 and the nonvolatile memory 12 and the wiring 23 on the first main surface S1 are electrically connected. The resist 24 covers the wiring 23. Further, the wiring 23 and the resist 24 may be similarly provided on the second main surface S2 of the first rigid substrate 2.

A via 25 is provided extending from the wiring 23 toward the conductive portion 22 in the Z direction and electrically connects the wiring 23 on the first main surface S1 and the second main surface S2 and the conductive portion 22. By way of the via 25, the semiconductor components and the flexible substrate 4 are electrically connected.

The connection between the second rigid substrate 3 and the flexible substrate 4 will be described with reference to FIG. 6. The connection portion 31 of the second rigid substrate 3 is recessed toward the center of the substrate, similarly to the first rigid substrate 2. A conductive portion 32 is provided along the recessed portion. The flexible substrate 4 is connected to a portion of the conductive portion 32 that is substantially parallel to the Z direction, e.g., substantially vertical. The area of the connection portion 31 between the flexible substrate 4 and the conductive portion 32 is filled with an insulating portion 36.

A wiring 33, a resist 34, and the connector 5 are provided on the fifth main surface S5 of the second rigid substrate 3. The resist 34 covers the wiring 33. The connector 5 is a metal terminal, and is called a Gold Finger. The second rigid substrate 3 is inserted into the socket 6 of the host 13 in the X direction. The host 13 and the memory system 1 are electrically connected by the contact between a metal terminal (not shown) in the socket 6 and the connector 5. The connector 5 and the wiring 33 on the fifth main surface S5 are electrically connected. Further, the wiring 33 and the resist 34 may be similarly provided on the sixth main surface S6 of the second rigid substrate 3.

A via 35 is provided extending from the wiring 33 toward the conductive portion 32 in the Z direction and electrically connects the wiring 33 on the fifth main surface S5 and the sixth main surface S6 and the conductive portion 32. By way of the via 35, the connector 5 and the flexible substrate 4 are electrically connected.

The memory system 1 according to the present embodiment achieves the thickness value set by the standard (0.8 mm for an M.2 Module) for the second rigid substrate 3 by physically and electrically connecting the first rigid substrate 2 and the second rigid substrate 3 having different thicknesses by using the flexible substrate 4. In addition, the thickness of the first rigid substrate 2 on which the components are mounted can be made thinner than the thickness value set by the standard, and the thickness of the entire memory system 1 when the memory system 1 is mounted on the mother substrate 8 can be made thinner. Since the flexible substrate 4 has flexibility, an excessive load is not generated, and it is possible to physically and electrically connect the first rigid substrate 2 and the second rigid substrate 3 in a reliable manner.

(Modification)

Next, a modification of a memory system according to the first embodiment will be described.

Figure 7A:
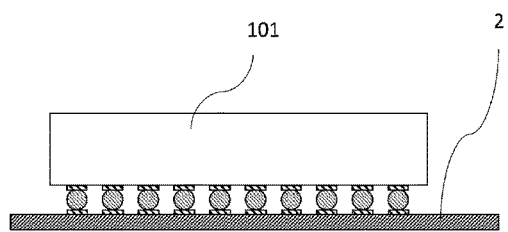
FIGS. 7A and 7B are cross-sectional views of a memory system according to a modification of the first embodiment.
Figure 7B:
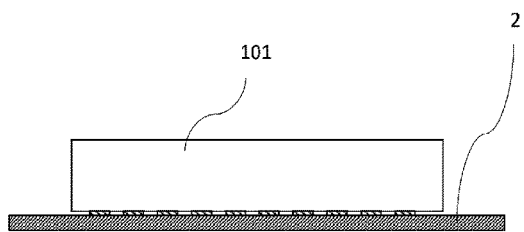

FIGS. 7A and 7B are cross-sectional views of the first rigid substrate 2 of the memory system according to the modification. In the first embodiment, as shown in FIG. 7A, a semiconductor component 101 such as the controller 11 and the nonvolatile memory 12 is mounted on the first rigid substrate 2 in the BGA. In the modification, as shown in FIG. 7B, the semiconductor component 101 is mounted on the first rigid substrate 2 in a land grid array (LGA). Whereas the BGA uses solder balls to connect the bottom surface of the semiconductor component 101 to the first rigid substrate 2, the LGA uses paste-like solder to connect the bottom surface of the semiconductor component 101 to the first rigid substrate 2. The LGA has a smaller gap between the semiconductor component 101 and the first rigid substrate 2 than the BGA does. This makes it possible to reduce the thickness of the memory system 1 even more with the modification.

Second Embodiment

Next, the structure of a memory system according to a second embodiment will be described.

Figure 8:
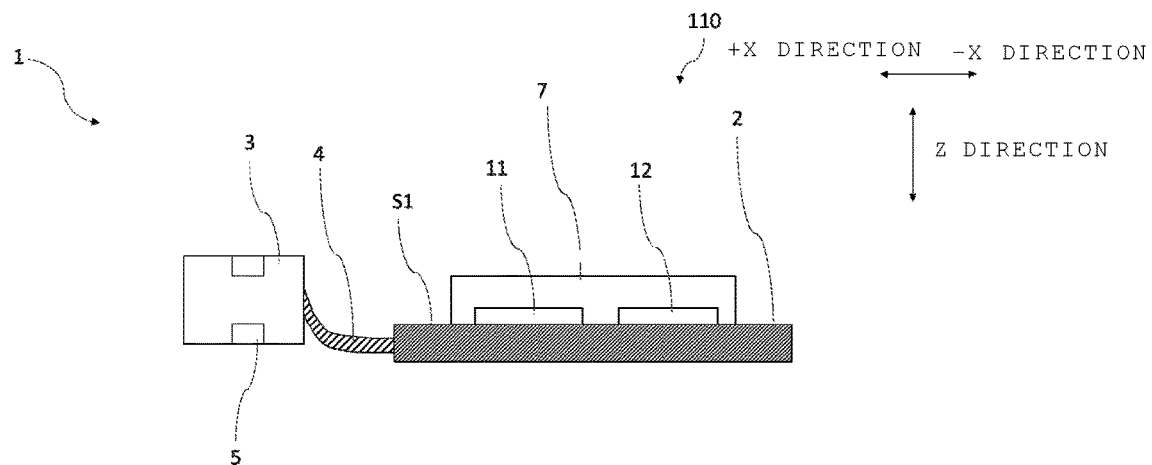
FIG. 8 is a cross-sectional view of a memory system according to a second embodiment.

FIG. 8 is a cross-sectional view showing a part of the configuration of the information processing system 110 of the present embodiment.

For each part of the memory system 1 of the second embodiment, the same parts as each part of the memory system 1 of the first embodiment are indicated by the same reference numerals. As shown in FIG. 8, the memory system 1 according to the second embodiment is different from the first embodiment in that a semiconductor package 7 is mounted on the first main surface S1 of the first rigid substrate 2. The semiconductor package 7 is an example of a semiconductor component. In the semiconductor package 7 according to the present embodiment, the controller 11 and at least one nonvolatile memory 12 are integrated into one package. The semiconductor package 7 is mounted on the first rigid substrate 2 in, for example, the BGA.

The controller 11 and at least one nonvolatile memory 12 are connected to each other by a wiring in the semiconductor package 7. Therefore, it is not necessary to provide a wiring for connecting the controller 11 and at least one nonvolatile memory 12 on the first rigid substrate 2. By mounting the semiconductor package 7 on the first rigid substrate 2 instead of mounting the controller 11 and at least one nonvolatile memory 12 on the first rigid substrate 2, the wiring of the first rigid substrate 2 can be simplified. As a consequence, the thickness of the first rigid substrate 2 can be reduced, and the thickness of the memory system 1 can be reduced.

Third Embodiment

Next, the structure of a memory system according to a third embodiment will be described.

Figure 9:
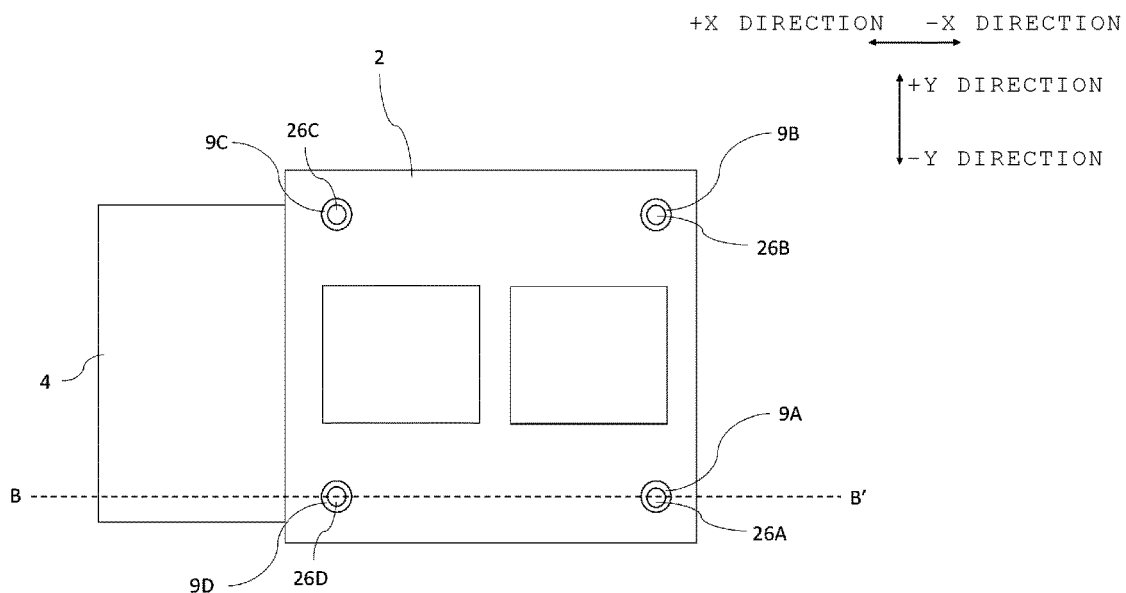
FIG. 9 is a top view of a memory system according to a third embodiment.
Figure 10:
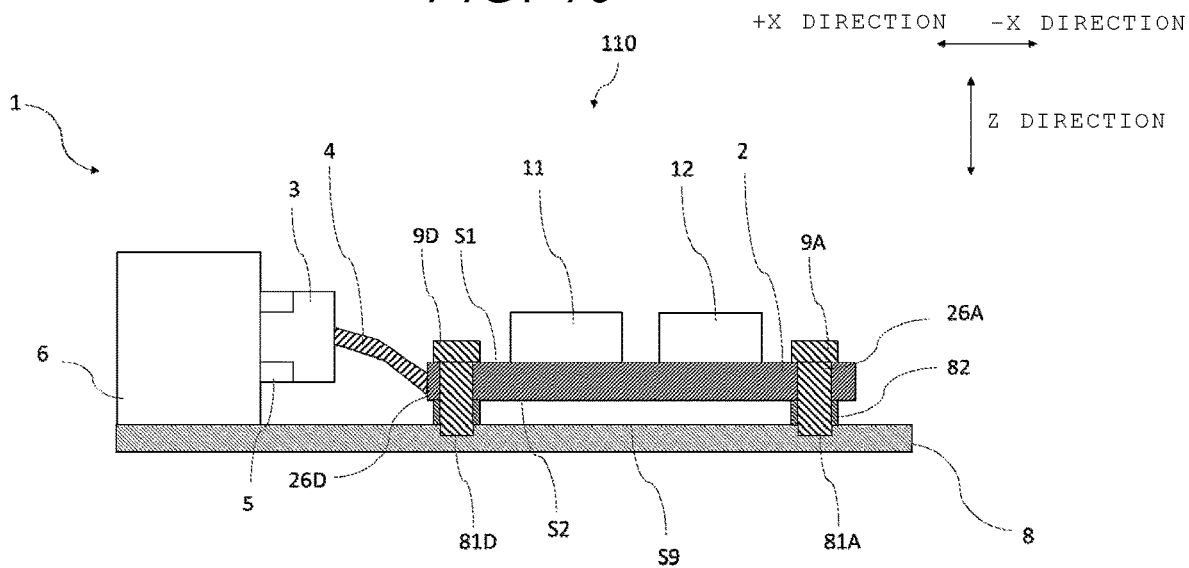
FIG. 10 is a cross-sectional view showing a partial configuration of an information processing system in which the memory system according to the third embodiment is mounted on a mother substrate.

FIG. 9 is a top view of the memory system 1 according to the third embodiment. FIG. 10 is a cross-sectional view showing a part of the configuration of the information processing system 110 in which the memory system of the present embodiment is mounted on the mother substrate.

For each part of the memory system 1 of the third embodiment, the same parts as each part of the memory system 1 of the first embodiment are indicated by the same reference numerals. The memory system 1 according to the third embodiment is different from the first embodiment in that screws 9A to 9D are used as a member that fixes the first rigid substrate 2 to the mother substrate 8 on which the memory system 1 is mounted.

In the second embodiment, four screw holes are disposed at the four corners of the mother substrate 8. Two of the four screw holes, screw holes 81A, 81D are shown in FIG. 10. As shown in FIG. 9, through holes 26A to 26D are provided at the four corners of the first rigid substrate 2. The screw 9A can be inserted into the through hole 26A. The screws 9A to 9D are made of metal, and the thermal conductivity of the screws 9A to 9D is higher than that of the first rigid substrate 2.

FIG. 10 is a cross-sectional view seen from the dotted line B-B' of FIG. 9. As shown in FIG. 10, the memory system 1 is disposed on the spacer 82 provided on a ninth main surface S9 on the mother substrate 8, and the height of the spacer is defined by the M.2 standard. The controller 11 and the nonvolatile memory 12 are provided on the first main surface S1 of the first rigid substrate 2. The screw 9A penetrates the first rigid substrate 2 in the Z direction, reaches the mother substrate 8, and is attached to the screw hole 81A provided in the mother substrate 8. The screw 9A can be inserted into and engaged with the screw hole 81A. The screw 9B is inserted into and engaged with the screw hole (not shown) through the through hole 26B. The screw 9C is inserted into and engaged with the screw hole (not shown) through the through hole 26C. The screw 9D is inserted into and engaged with the screw hole 81D through the through hole 26D.

A gap is created between the first rigid substrate 2 and the mother substrate 8 by the spacer 82. The heat generated by the controller 11 and the nonvolatile memory 12 on the first rigid substrate 2 is not directly transmitted from the first rigid substrate 2 to the mother substrate 8. By fixing the first rigid substrate 2 with the screws 9, the heat generated by the controller 11 and the nonvolatile memory 12 is transmitted to the first rigid substrate 2, the screws 9, and the mother substrate 8 in this order and released. This makes it possible to prevent from increasing in the temperature of the first rigid substrate 2. The number of screws 9 is not limited to four, and three or more screws may be provided.

Fourth Embodiment

Next, the structure of a memory system according to a fourth embodiment will be described.

Figure 11:
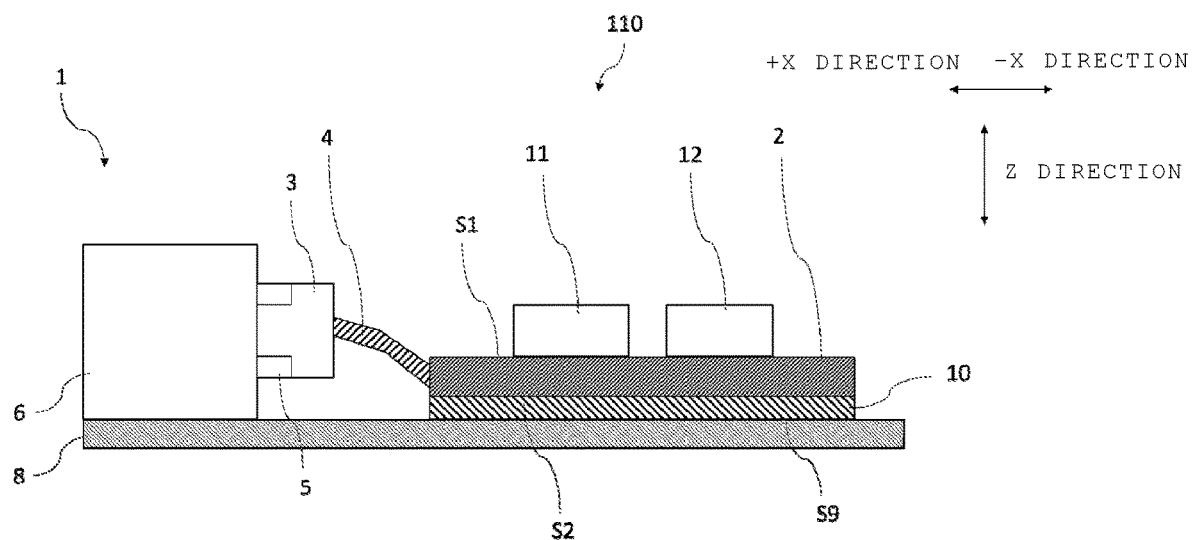
FIG. 11 is a cross-sectional view showing a partial configuration of an information processing system in which a memory system according to a fourth embodiment is disposed on a mother substrate.

FIG. 11 is a cross-sectional view showing a part of the configuration of the information processing system 110 in which the memory system of the present embodiment is mounted on the mother substrate.

For each part of the memory system 1 of the fourth embodiment, the same parts as each part of the memory system of the third embodiment are indicated by the same reference numerals. The memory system 1 according to the fourth embodiment is different from the third embodiment in that a thermal interface material (TIM) is used as a member that fixes the first rigid substrate 2 to the mother substrate 8 on which the memory system 1 is mounted.

The controller 11 and the nonvolatile memory 12 are provided on the first main surface S1 of the first rigid substrate 2. A TIM 10 is provided between the second main surface S2 of the first rigid substrate 2 and the ninth main surface S9 of the mother substrate 8. That is, the first rigid substrate 2 and the mother substrate 8 are adhered to each other by the TIM 10. The TIM 10 is a heat-dissipating material with high thermal conductivity, and grease, elastomer sheet, room temperature vulcanization (RTV), gel, and the like are used. The TIM 10 is, for example, a plate-shaped heat-dissipating member.

The heat generated by the controller 11 and the nonvolatile memory 12 on the first rigid substrate 2 is transmitted to the first rigid substrate 2, the TIM 10, and the mother substrate 8 in this order and released. As a result, it is possible to efficiently transfer the heat of the first rigid substrate 2 and prevent from increasing in the temperature of the first rigid substrate 2. Further, by using the first rigid substrate 2 having a reduced thickness in combination, even if the TIM 10 is provided, the total thickness of the first rigid substrate 2 and the TIM 10 does not exceed the thickness of the second rigid substrate 3. That is, the position of the first main surface S1 of the first rigid substrate is not higher than the position of the fifth main surface S5 of the second rigid substrate. It is possible to efficiently dissipate the heat of the controller 11 and the nonvolatile memory 12 while reducing the thickness of the memory system 1.

Fifth Embodiment

Next, the structure of a memory system according to a fifth embodiment will be described. Electromagnetic waves generated from the semiconductor component 101 mounted on the memory system 1 may cause the electronic device to malfunction. The memory system 1 mounted on the electronic device is required to have characteristics that do not emit electromagnetic waves as much as possible. In addition, the memory system 1 is also required to have characteristics so as not to malfunction due to the influence of electromagnetic waves from other components mounted on the electronic device.

Figure 12:
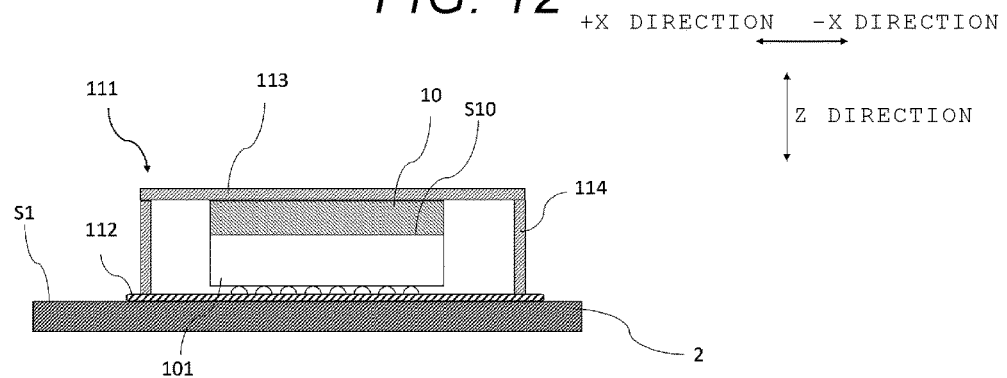
FIG. 12 is a cross-sectional view of a memory system according to a fifth embodiment.

FIG. 12 is a cross-sectional view of the memory system 1 according to the fifth embodiment. For each part of the memory system. 1 of the fifth embodiment, the same parts as each part of the memory system 1 of the first embodiment are indicated by the same reference numerals. The memory system 1 according to the fifth embodiment is different from the first embodiment in that the TIM 10 is provided above the semiconductor component 101 mounted on the first rigid substrate 2, and an enclosure 111 covers the semiconductor component 101 and the TIM 10.

The semiconductor component 101 is provided on the first main surface S1 of the first rigid substrate 2. Among the two main surfaces of the semiconductor component 101, the surface opposite to the surface in contact with the first main surface S1 of the first rigid substrate 2 is referred to as a tenth main surface S10. The tenth main surface S10 is in contact with the TIM 10. The length of the TIM 10 in the X direction is the same as the length of the tenth main surface S10 of the semiconductor component 101 in the X direction. The length of the TIM 10 in the Y direction is the same as the length of the tenth main surface S10 of the semiconductor component 101 in the Y direction. A pad 112 is provided on the first rigid substrate 2 so as to surround the semiconductor component 101. The pad 112 is a conductor. Further, the enclosure 111 covers the TIM 10 and the semiconductor component 101. The enclosure 111 is composed of one top plate 113 and four side plates 114. The side plates 114 are connected to the top plate 113. The side plate 114 is provided with one end in the +Z direction in contact with the top plate 113 and the other end in the −Z direction in contact with the pad 112. The height of the side plate 114 in the Z direction is greater than the thickness of the semiconductor component 101 in the Z direction. The length of the top plate 113 in the X direction is greater than the length of the tenth main surface of the semiconductor component 101 in the X direction. The length of the top plate 113 in the Y direction is greater than the length of the tenth main surface S10 of the semiconductor component 101 in the Y direction. The TIM 10 is provided between the enclosure 111 and the semiconductor component 101. The TIM 10 fills the space between the semiconductor component 101 and the enclosure 111. The enclosure 111 is made of, for example, metal, ceramic or plastic.

By providing the enclosure 111 so as to cover the semiconductor component 101, electromagnetic waves generated from the semiconductor component 101 are less likely to be transmitted to other electronic components. Further, it is less susceptible to the influence of electromagnetic waves from other components mounted on the electronic device. This makes it possible to improve the quality of the information processing system.

Further, the heat generated by the semiconductor component 101 on the first rigid substrate 2 is transmitted to TIM 10 and the enclosure 111 in this order and is released into the air. Alternatively, the generated heat is transmitted to the TIM 10, the enclosure 111, the pad 112, and the mother substrate 8 in this order and released. As a result, it is possible to efficiently transfer the heat of the first rigid substrate 2 and prevent from increasing in the temperature of the first rigid substrate 2. In addition, by using the first rigid substrate 2 having a reduced thickness in combination, even if the TIM 10 is provided, the total thickness of the first rigid substrate 2, the TIM 10, the semiconductor component 101, the pad 112, and the top plate 113 does not exceed the thickness of the socket 6. For example, the position of the first main surface S1 of the first rigid substrate is not higher than the position of the fifth main surface S5 of the second rigid substrate. For example, the position of the top plate 113 is not higher than the position of the upper surface of the socket 6. It is possible to efficiently dissipate heat from semiconductor components while reducing the thickness of the memory system 1.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein maybe made without departing from the spirit of the disclosure. The accompanying claims and their equivalents are intended to cover such forms or modifications as would fall within the scope and spirit of the disclosure.

What is claimed is:
1. A memory system comprising:
  a nonvolatile memory;
  a controller that is configured to control the nonvolatile memory;
  a connector configured to electrically connect the controller and a host;
  a first rigid substrate on which the nonvolatile memory and the controller are mounted;
  a second rigid substrate on which the connector is mounted; and
  a flexible substrate that is flexible and electrically connects the first rigid substrate and the second rigid substrate, wherein
  a thickness of the first rigid substrate is less than a thickness of the second rigid substrate.
2. The memory system according to claim 1, wherein
  when the connector is inserted into a socket and the first rigid substrate is mounted on a mother substrate,
  the flexible substrate is bent, and an upper surface of the first rigid substrate is at a lower height from a surface of the mother substrate than an upper surface of the second rigid substrate.
3. The memory system according to claim 2, wherein
  the connector is provided at one end of the second rigid substrate for connection with the socket mounted on the mother substrate.
4. The memory system according to claim 3, wherein
  a position of the upper surface of the first rigid substrate is lower than a position of an upper surface of the socket.
5. The memory system according to claim 1, wherein
  a semiconductor component is not mounted on the second rigid substrate.
6. The memory system according to claim 1, wherein
  the thickness of the second rigid substrate is defined by a predetermined form factor standard that is applicable to the memory system connected to the host.
7. The memory system according to claim 1, wherein
  the controller and the nonvolatile memory are sealed in one package.
8. The memory system according to claim 7, wherein
  a total thickness of the first rigid substrate and the package is less than a thickness of a socket to which the connector is connected.
9. The memory system according to claim 1, wherein
  the controller and the nonvolatile memory are mounted on the first rigid substrate through a land grid array (LGA).
10. The memory system according to claim 1, wherein
  the first rigid substrate is formed with at least one screw hole, and the first rigid substrate is capable of being attached to the mother substrate by using at least one screw inserted into and engaged with the screw hole.
11. The memory system according to claim 1, further comprising:
  a plate-shaped heat-dissipating member, wherein
  the first rigid substrate is mounted on the heat-dissipating member to be in contact therewith.
12. The memory system according to claim 11, wherein
  a total thickness of the heat-dissipating member and the first rigid substrate is less than the thickness of the second rigid substrate.
13. The memory system according to claim 1, wherein
  the first rigid substrate and an electronic component mounted on the first rigid substrate are sealed by an enclosure.
14. An information processing system comprising:
  a host comprising a socket and a mother substrate on which the socket is mounted; and
  a memory system mounted on the mother substrate, wherein the memory system includes a nonvolatile memory, a controller configured to control the nonvola- tile memory, a connector configured to electrically connect the controller and the host by way of the socket, a first rigid substrate on which the nonvolatile memory and the controller are mounted, a second rigid substrate on which the connector is mounted, and a flexible substrate that is flexible and electrically connects the first rigid substrate and the second rigid substrate, wherein a thickness of the first rigid substrate is less than a thickness of the second rigid substrate.

15. The information processing system according to claim 14, wherein
when the connector is inserted into the socket, the flexible substrate is bent, and an upper surface of the first rigid substrate is at a lower height from a surface of the mother substrate than an upper surface of the second rigid substrate.

16. The information processing system according to claim 15, wherein
a position of the upper surface of the first rigid substrate is lower than a position of an upper surface of the socket.

17. The information processing system according to claim 14, wherein
the controller and the nonvolatile memory are sealed in one package.

18. The information processing system according to claim 17, wherein
a total thickness of the first rigid substrate and the package is less than a thickness of a socket to which the connector is connected.

19. The information processing system according to claim 14, wherein
the controller and the nonvolatile memory are mounted on the first rigid substrate through a land grid array (LGA).

20. The information processing system according to claim 14, wherein
the first rigid substrate is formed with at least one screw hole, and the first rigid substrate is attached to the mother substrate by using at least one screw inserted into and engaged with the screw hole.

* * * * *